United States Patent
Mori et al.

(10) Patent No.: US 9,813,651 B2
(45) Date of Patent: Nov. 7, 2017

(54) SOLID-STATE IMAGING DEVICE

(71) Applicant: Panasonic Intellectual Property Management Co., Ltd., Osaka (JP)

(72) Inventors: Mitsuyoshi Mori, Kyoto (JP); Hirohisa Ohtsuki, Toyama (JP); Yoshiyuki Ohmori, Osaka (JP); Yoshihiro Sato, Osaka (JP); Ryohei Miyagawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 99 days.

(21) Appl. No.: 14/579,592

(22) Filed: Dec. 22, 2014

(65) Prior Publication Data
US 2015/0109503 A1 Apr. 23, 2015

Related U.S. Application Data

(63) Continuation of application No. PCT/JP2013/001510, filed on Mar. 8, 2013.

(30) Foreign Application Priority Data

Jun. 27, 2012 (JP) .................................. 2012-144763

(51) Int. Cl.
*H04N 5/335* (2011.01)
*H04N 3/14* (2006.01)
(Continued)

(52) U.S. Cl.
CPC ......... *H04N 5/378* (2013.01); *H01L 27/1461* (2013.01); *H01L 27/1464* (2013.01);
(Continued)

(58) Field of Classification Search
CPC ......... H01L 27/14609; H01L 27/14643; H01L 27/14603; H01L 27/14641;
(Continued)

(56) References Cited

U.S. PATENT DOCUMENTS 8,120,077 B2 2/2012 Katsuno et al.
8,223,234 B2 7/2012 Inuiya
(Continued)

FOREIGN PATENT DOCUMENTS

JP 2006-196884 A 7/2006
JP 2008-124395 A 5/2008
(Continued)

OTHER PUBLICATIONS

International Search Report issued in PCT/JP2013/001510, dated Apr. 23, 2013, with English translation.

*Primary Examiner* — Lin Ye
*Assistant Examiner* — Euel Cowan
(74) *Attorney, Agent, or Firm* — McDermott Will & Emery LLP (57) ABSTRACT

A solid-state imaging device according to the present disclosure includes pixels arranged two-dimensionally, each of the pixels including: a metal electrode; a photoelectric conversion layer that is on the metal electrode and converts light into an electrical signal; a transparent electrode on the photoelectric conversion layer; an electric charge accumulation region that is electrically connected to the metal electrode and accumulates electric charges from the photoelectric conversion layer; an amplifier transistor that applies a signal voltage according to an amount of the electric charges in the electric charge accumulation region; and a reset transistor that resets electrical potential of the electric charge accumulation region, in which the reset transistor includes a gate oxide film thicker than a gate oxide film of the amplifier transistor.

12 Claims, 5 Drawing Sheets

(51) Int. Cl.
*H04N 5/378* (2011.01)
*H01L 27/146* (2006.01)
*H04N 5/3745* (2011.01)

(52) U.S. Cl.
CPC .. *H01L 27/14603* (2013.01); *H01L 27/14645* (2013.01); *H04N 5/3745* (2013.01)

(58) Field of Classification Search
CPC ......... H01L 27/14614; H01L 27/14812; H01L 27/1461; H01L 27/14831; H04N 5/3745; H04N 3/155; H04N 5/378
USPC ............. 348/211.9, 266, 275, 294, 300, 302, 348/373–376; 257/294; 250/239
See application file for complete search history.

(56) References Cited

U.S. PATENT DOCUMENTS

| | | | |
|---|---|---|---|
| 8,378,391 B2* | 2/2013 | Koyama | H01L 27/1225 257/223 |
| 8,507,961 B2* | 8/2013 | Takagi | H01L 27/14603 257/290 |
| 8,772,844 B2 | 7/2014 | Katsuno et al. | |
| 2006/0131624 A1 | 6/2006 | Katsuno et al. | |
| 2009/0179293 A1* | 7/2009 | Shim | H01L 27/14634 257/458 |
| 2010/0060756 A1 | 3/2010 | Inuiya | |
| 2010/0118170 A1* | 5/2010 | Matsumoto | H01L 27/14603 348/294 |
| 2010/0283048 A1* | 11/2010 | Park | H01L 27/14609 257/43 |
| 2011/0134264 A1* | 6/2011 | Nishihara | H01L 27/14609 348/222.1 |
| 2011/0249163 A1* | 10/2011 | Ikeda | H01L 27/14609 348/308 |
| 2012/0098044 A1 | 4/2012 | Katsuno et al. | |

FOREIGN PATENT DOCUMENTS

| | | |
|---|---|---|
| JP | 2009-164604 A | 7/2009 |
| JP | 2010-067828 A | 3/2010 |
| JP | 2011-216728 A | 10/2011 |
| JP | 2012-060076 A | 3/2012 |
| WO | 2012-005010 A1 | 1/2012 |
| WO | 2012/005010 A1 | 1/2012 |
| WO | 2012-035696 A1 | 3/2012 |

* cited by examiner

Prior Art

SOLID-STATE IMAGING DEVICE

CROSS REFERENCE TO RELATED APPLICATIONS

This is a continuation application of PCT International Application No. PCT/JP2013/001510 filed on Mar. 8, 2013, designating the United States of America, which is based on and claims priority of Japanese Patent Application No. 2012-144763 filed on Jun. 27, 2012. The entire disclosures of the above-identified applications, including the specifications, drawings and claims are incorporated herein by reference in their entirety.

FIELD

The present disclosure relates to a solid-state imaging device including an array of pixels.

BACKGROUND

Stacked sensors have been proposed in which photoelectrically convertible materials are stacked above semiconductor substrates and which allow a large amount of saturation electric charge even in miniaturized pixels.

Figure 5:
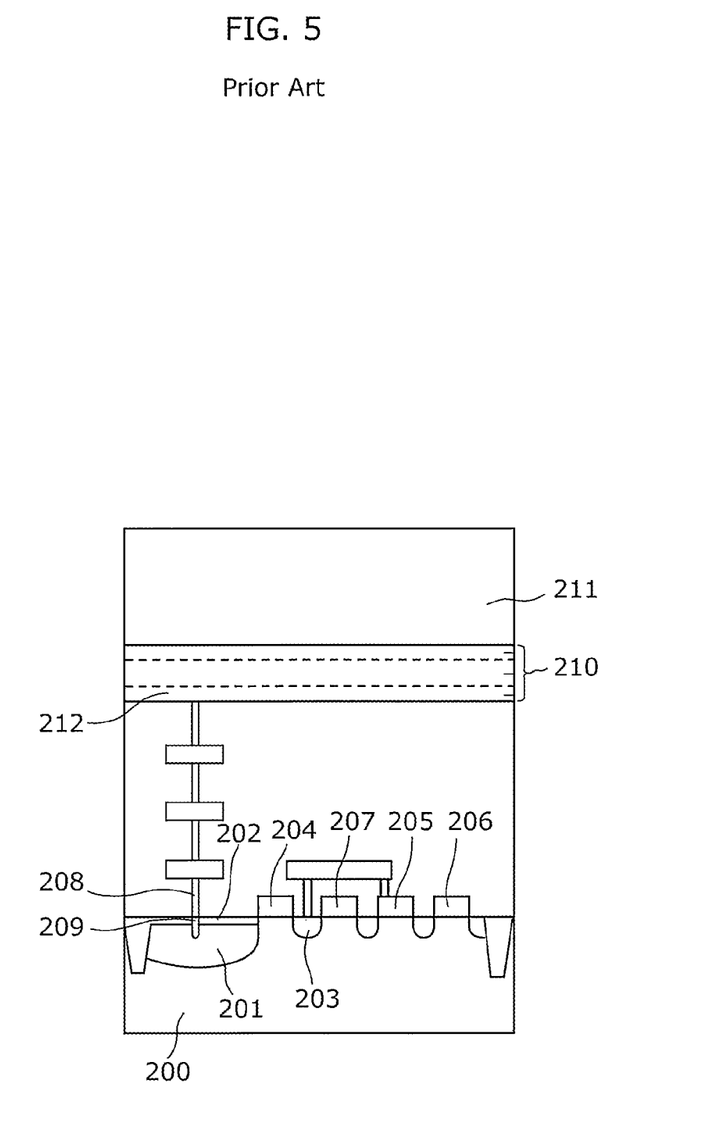
FIG. 5 is a cross sectional view of a pixel of a stacked imaging sensor described in PTL 1.

FIG. 5 is a cross sectional view of a pixel in a stacked imaging sensor described in Patent Literature (PTL) 1. As shown in FIG. 5, a photoelectric conversion layer 210, a transparent electrode 211, and a pixel electrode 212 are formed above a semiconductor substrate 200. Moreover, plural impurity regions included in output circuits are formed in the semiconductor substrate 200. The impurity region includes an n-type electric charge accumulation part 201 for accumulating electric charges generated in the photoelectric conversion layer 210 and a p-type surface doping region 202 for reducing leakage caused by a surface defect of the semiconductor substrate 200 at the top of the electric charge accumulation part 201. Moreover, in order to output the electric charges accumulated in the charge accumulation part 201 to a signal line, a transfer transistor 204 for transferring the electric charges to a floating diffusion part 203 is formed. The floating diffusion part 203 is connected to a gate of an amplifier transistor 205 in order to convert the electric charges into a voltage according to the amount of the electric charges, and a selection transistor 206 is formed in the floating diffusion part 203 in order to select pixels to be outputted to the signal line. Moreover, a reset transistor 207 is formed to reset electrical potential of the floating diffusion part 203. Moreover, a contact 208 is provided in order to transmit photoelectric charges generated in the photoelectric conversion layer 210 to the electric charge accumulation part 201, and an n-type contact doping region 209 having a high dopant concentration is formed in order to decrease a contact resistance.

CITATION LIST

Patent Literature

[PTL 1] Japanese Unexamined Patent Application Publication No. 2009-164604

SUMMARY

Technical Problem

The p-type surface doping region 202 and an n-type contact doping region 209 generate a pn junction near the contact 208 in a surface of the semiconductor substrate 200. A leakage current in the pn junction depends on an electric field intensity of the junction area. Therefore, the dopant concentration of the surface doping region 202 cannot be set above a certain level for the purpose of reducing the leakage current in the junction area.

However, the surface doping region 202 is originally provided for the purpose of reducing a leakage current caused by a defect near an end of a gate where a surface defect of the surface doping region 202 is easily induced especially in processing. Therefore, a decrease in the dopant concentration results in insufficient suppression of a leakage current that is caused by such a defect.

In view of the aforementioned problem, one non-limiting and explanatory embodiment provides a stacked solid-state imaging device having a high sensitivity and in which a leakage current is suppressed.

Solution to Problem

In order to solve the aforementioned problem, the solid-state imaging device according to the present disclosure includes pixels arranged two-dimensionally, each of the pixels including: a metal electrode; a photoelectric conversion layer that is on the metal electrode and converts light into an electrical signal; a transparent electrode on the photoelectric conversion layer; an electric charge accumulation region that is electrically connected to the metal electrode and accumulates electric charges from the photoelectric conversion layer; an amplifier transistor that applies a signal voltage according to an amount of the electric charges in the electric charge accumulation region; and a reset transistor that resets electrical potential of the electric charge accumulation region, in which the reset transistor includes a gate oxide film thicker than a gate oxide film of the amplifier transistor.

With the above configuration, a high voltage can be applied to a gate electrode of the reset transistor, electric charges included in the surface doping region are collected near an end of a gate, and an electrical potential of the surface doping region can be stabilized, thereby suppressing a leakage current.

Advantageous Effects

With the solid-state imaging device according to the present disclosure, it is possible to reduce a leakage current in the electric charge accumulation part, reduce 1/f noise, and implement a solid-state imaging device having a high sensitivity (S/N).

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Hereinafter, detailed descriptions will be given of the embodiments with reference to the drawings. It is to be noted that the present disclosure is not limited to the embodiments described below. Moreover, any modifications are possible without departing from a range in which the present disclosure provides advantageous effects. Furthermore, combinations with other embodiments are also possible.

Embodiment 1

Figure 1:
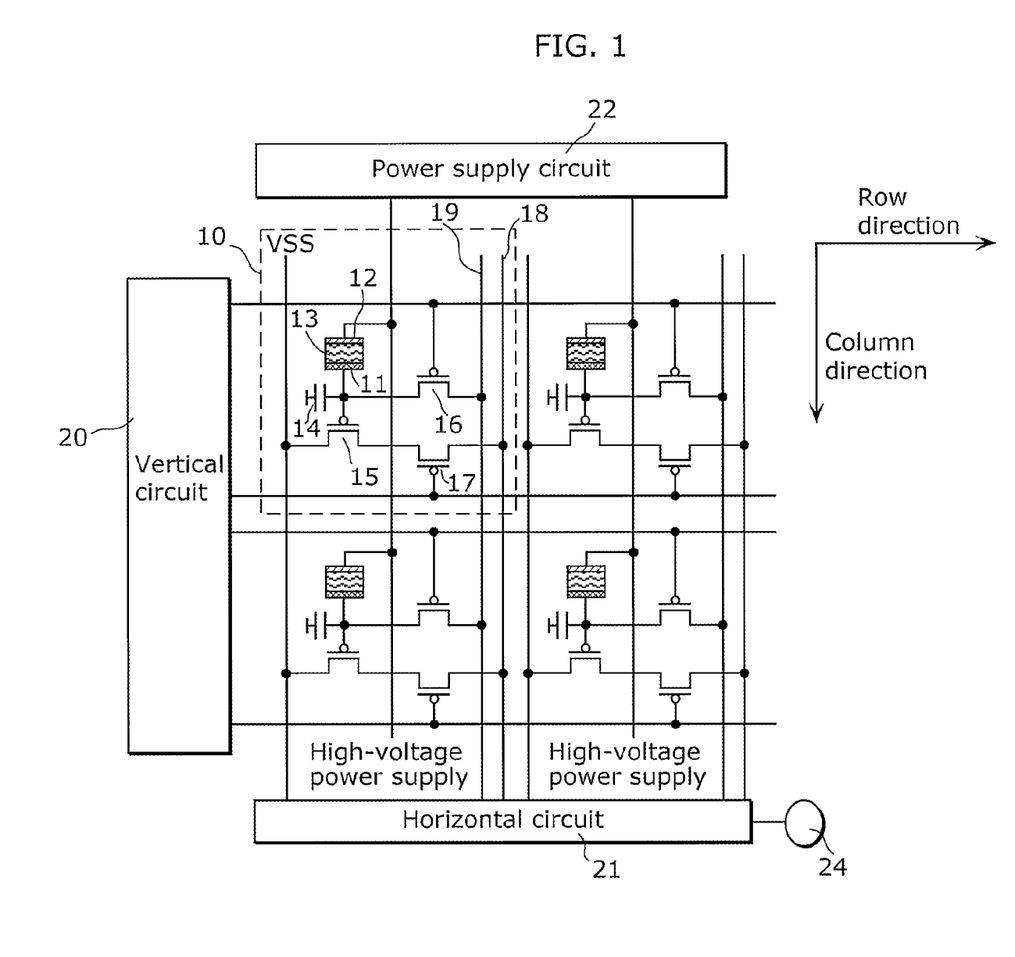
FIG. 1 is a circuit diagram illustrating an example of a solid-state imaging device according to embodiments.

First, a description is given of an example of a structure of a pixel circuit in a solid-state imaging device according to Embodiment 1 with reference to FIG. 1.

FIG. 1 is a circuit diagram illustrating an example of a solid-state imaging device according to embodiments. The solid-state imaging device in FIG. 1 is an example of stacked imaging sensors in which pixels 10 are two-dimensionally arranged. The pixel 10 includes therein a metal electrode 11, a photoelectric conversion layer 13 that is formed on the metal electrode 11 and converts light into an electrical signal, a transparent electrode 12 formed on the photoelectric conversion layer 13, an electric charge accumulation region (floating diffusion) 14 that accumulates the electric charges from the photoelectric conversion layer 13, an amplifier transistor 15 that applies a signal voltage according to the amount of the electric charges in the electric charge accumulation region 14, a reset transistor 16 that resets electrical potential of the electric charge accumulation region, and a selection transistor 17.

The photoelectric conversion layer 13 performs photoelectric conversion on incident light to generate a signal electric charge. The signal electric charge generated by the photoelectric conversion layer 13 is transferred to the electric charge accumulation region 14 via the metal electrode 11. In this embodiment, a positive bias voltage of approximately 10 V is applied to a transparent electrode 12 in order to transfer the electric charge.

The electric charge transferred to the electric charge accumulation region 14 is amplified by the amplifier transistor 15. When the selection transistor 17 enters an ON state, the signal amplified by the amplifier transistor 15 is outputted to an output signal line 18.

In order to remove thermal (kTC) noise generated in an operation of the reset transistor 16, a noise component having opposite phase is returned from the output signal line 18 to the electric charge accumulation region 14 via a feedback line 19 to cancel out the thermal (kTC) noise.

Signals for controlling transistors in the pixel are provided from a vertical circuit 20 and outputted to a signal terminal 24 via a horizontal circuit 21. The voltage of approximately 10 V to be applied to the transparent electrode 12 is generated by a power source circuit 22 provided in the same chip for the purpose of miniaturization.

Subsequently, an example of a cross-sectional structure of the pixel 10 included in the solid-state imaging device according to Embodiment 1 will be described with reference to FIG. 2A.

Figure 2A:
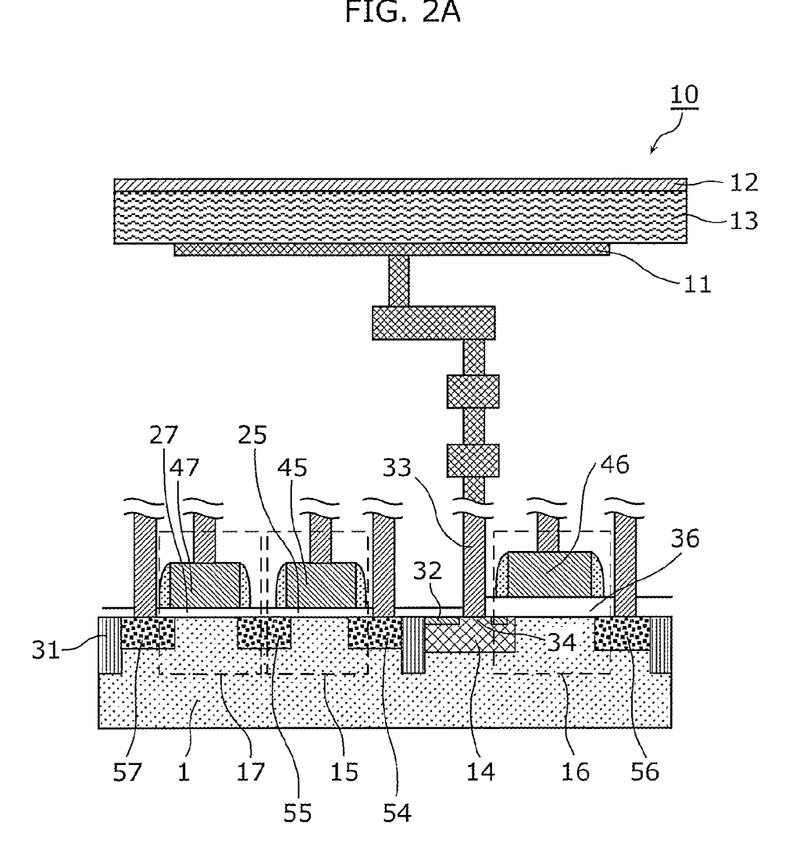
FIG. 2A is a cross sectional view illustrating an example of a structure of a pixel according to the embodiments.

FIG. 2A is a cross sectional view illustrating an example of a structure of a pixel according to the embodiments. As illustrated in the diagram, the pixel 10 in the solid-state imaging device according to this embodiment includes an n-type well 1 formed in a semiconductor substrate, the photoelectric conversion layer 13 that is formed above the semiconductor substrate and performs a photoelectric conversion on incident light to generate a signal electric charge, and the metal electrode 11 and the transparent electrode 12 having the photoelectric conversion layer 13 therebetween. The transparent electrode 12 is made of, for example, ITO or ZnO in order to allow light to enter the photoelectric conversion layer 13.

In this embodiment, the n-type well 1 formed in the semiconductor substrate is used, but a p-type well formed in the semiconductor substrate may be used. In this case, the conductivity type of an impurity described below is switched between the n type and the p type.

Moreover, as for the electric charge generated in the photoelectric conversion layer 13, a hole is transferred via the metal electrode 11 by applying a positive voltage of approximately 10 V to the transparent electrode 12, and is accumulated in the p-type electric charge accumulation region 14. The electric charge accumulation region 14 also serves as an active region of the reset transistor 16, so that when the reset transistor 16 is turned ON, the electrical potential of the electric charge accumulation region 14 is reset.

Furthermore, the electric charge accumulation region 14 is electrically isolated from the amplifier transistor 15 and the selection transistor 17 within the pixel by an isolation region 31 of an n type or an isolation region 31 comprising shallow trench isolation (STI).

Moreover, providing an n-type surface doping region 32 at the top of the electric charge accumulation region 14 suppresses a leakage current into the electric charge accumulation region 14. In this regard, the leakage current is generated by a great number of defects that are present on the surface of the well 1.

Moreover, a contact doping region 34 for reducing contact resistance is provided at an interface between the semiconductor substrate and the contact 33 that is for transferring the electric charge from the photoelectric conversion layer 13 to the electric charge accumulation region 14. Moreover, the surface doping region 32 is extended to near an end of the gate of the reset transistor 16.

A gate oxide film 36 of the reset transistor 16 is thicker than the gate oxide film 25 of the amplifier transistor 15. This structure enables an application of a high gate voltage to the reset transistor 16. Thus, when the reset transistor 16 is OFF, it is possible to collect, under the gate, the electrons which are of the same type as major carriers included in the surface doping region 32 and stabilize the electrical potential of the surface doping region 32, thereby reducing the leakage current. In this embodiment, for example, a voltage is approximately 0 V when the reset transistor 16 is ON, and a voltage is approximately 3.8 V when the reset transistor 16 is OFF.

Moreover, forming the gate oxide film 25 of the amplifier transistor 15 to be thin can suppress the 1/f noise.

Moreover, a gate oxide film 27 of the selection transistor 17 has the same thickness as a gate oxide film 25 of the amplifier transistor 15. This structure can reduce the voltage applied to the gate in turning ON the selection transistor 17, thereby decreasing power consumption. It is to be noted that the above-described same thickness includes substantially the same thickness, that is, it includes an error in manufacturing.

In this embodiment, the gate oxide film 25 of the amplifier transistor 15 has a thickness ranging from approximately 3 nm to 6 nm, for example. Moreover, the gate oxide film 36 of the reset transistor 16 has a thickness ranging from approximately 4 nm to 13 nm, for example. Moreover, the gate oxide film 27 of the amplifier transistor 17 has a thickness ranging from approximately 3 nm to 6 nm, for example.

Figure 2B:
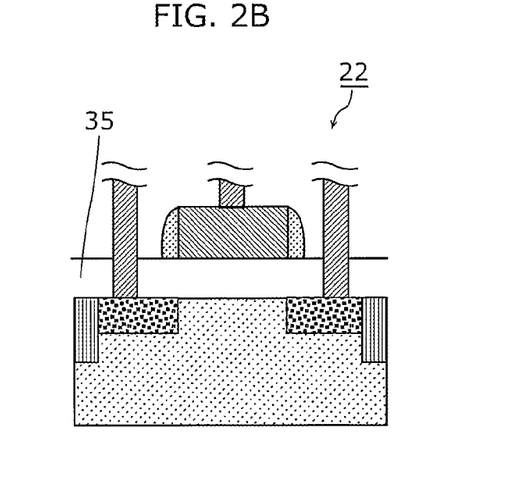
FIG. 2B is a cross sectional view illustrating an example of a structure of a power source circuit according to the embodiments.

FIG. 2B is a cross sectional view illustrating an example of a structure of a power source circuit according to the embodiments. The gate oxide film 35 of the transistor included in the power source circuit 22 that applies a voltage to the transparent electrode 12 is thicker than the gate oxide film 36 of the reset transistor 16. With this structure, it is possible to apply a high voltage to the transistor included in the power source circuit 22 and transmit the signal electric charge generated in the photoelectric conversion layer 13 to the electric charge accumulation region 14. The gate oxide film 35 has a thickness ranging from, for example, approximately 15 nm to 25 nm in order to apply a voltage of approximately 10 V to the transparent electrode 12.

In this embodiment, when a well voltage is approximately 2.8 V and the gate voltage of the reset transistor 16 is approximately 3.8 V, the leakage current is improved by several tens of percent.

Moreover, the gate oxide film 25 of the amplifier transistor 15 is made to be thin to the extent that insulation can be maintained between the well 1 and the gate electrode 45 of the amplifier transistor 15 when the electrical potential of the gate electrode 45 of the amplifier transistor 15 connected to the electric charge accumulation region 14 is reset to be reset electrical potential by the reset transistor 16. With this, 1/f noise N1/f which is a noise component other than the leakage current is reduced as apparent from the theoretical expression below. Here, Gox denotes the thickness of the gate oxide film, W denotes a channel width, and L denotes a gate length.

[Math 1]

$$N1/f \propto \sqrt{\frac{Gox}{W \cdot L}}$$ (Expression 1)

Next, a diagram illustrating a first plane structure of plural pixels 10 having a cross-sectional structure in FIG. 2A will be described with reference to FIG. 3 (the upper layer wiring is not illustrated).

Figure 3:
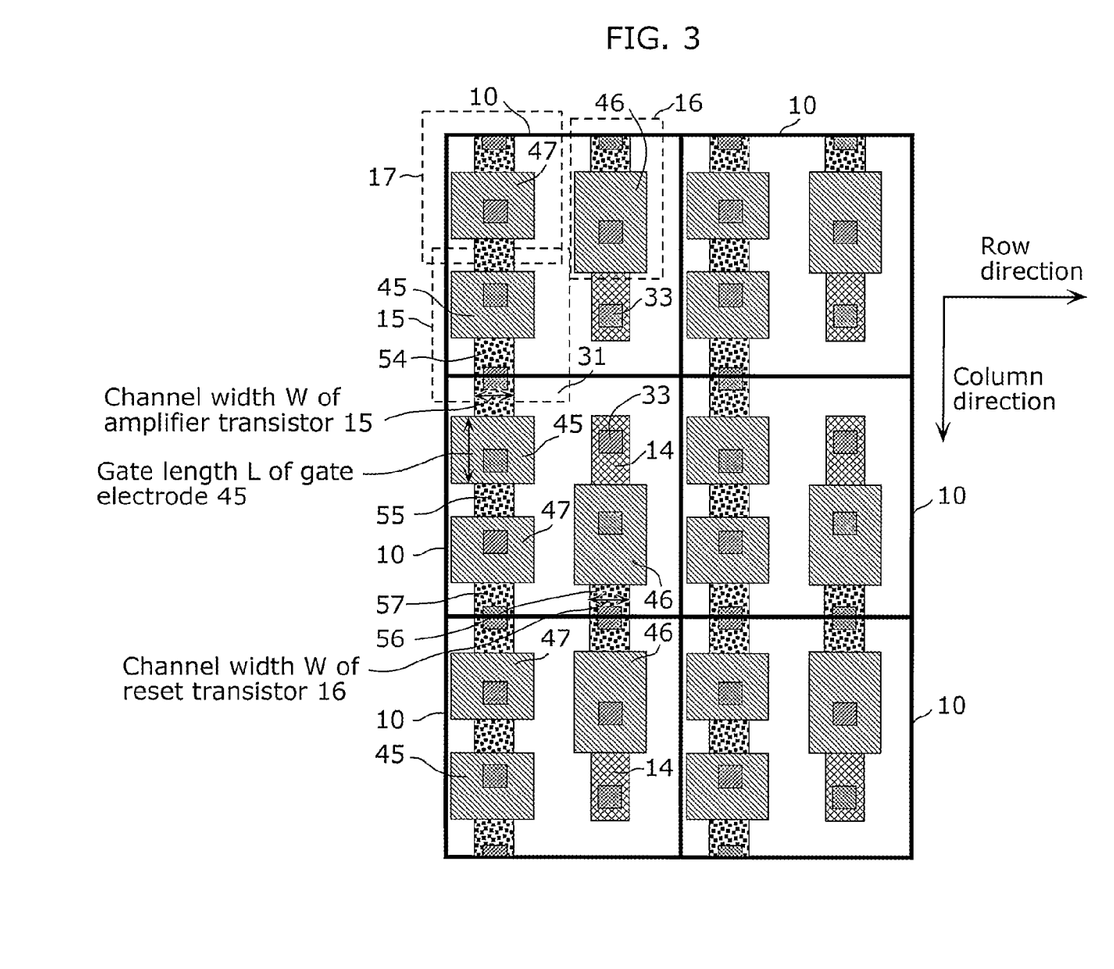
FIG. 3 is a plan view of a pixel in a solid-state imaging device according to Embodiment 1.

FIG. 3 is a plan view of pixels in the solid-state imaging device according to Embodiment 1. As illustrated in FIG. 3, the contact 33 of the electric charge accumulation region 14 in a pixel cannot be shared with an adjacent pixel 10 because, by doing so, the signal electric charges are mixed. Contacts other than the contact 33 can be shared with adjacent pixels 10 because the problem of mixture of the signal electric charges does not occur. Therefore, contacts other than the contact 33 are shared with vertically adjacent pixels 10 in a light receiving plane. This decreases a rate of a contact occupancy area per pixel, thereby miniaturizing the pixel size.

Moreover, an active region 54 is shared between the amplifier transistor 15 and the amplifier transistor 15 of the vertically adjacent pixel 10 in the light receiving plane. With this structure, since the contact is shared between the pixels 10 that are vertically adjacent to each other, the amplifier transistor 15 can have a sufficient gate length, thereby decreasing the 1/f noise, which is one of noise components.

Moreover, an active region 57 is shared between the selection transistor 17 and the selection transistor 17 of the vertically adjacent pixel 10 in the light receiving plane. With this structure, since the contact is shared between the pixels that are vertically adjacent to each other, the selection transistor can have a sufficient gate length, and the amplifier transistor 15 that shares the active region with the selection transistor 17 can have a sufficient gate length as well, thereby decreasing the 1/f noise, which is one of noise components.

Moreover, an active region 56 is shared between the reset transistor 16 and the reset transistor 16 of the vertically adjacent pixel 10 in the light receiving plane. With this structure, since the contact is shared between the pixels that are vertically adjacent to each other, the reset transistor 16 can have a sufficient gate length, and ON characteristics of the reset transistor 16 which uses the electric charge accumulation region 14 as the active region can be maintained.

Moreover, the reset transistor 16 has a gate length longer than the gate length of the amplifier transistor 15. With this structure, while ensuring a driving capability of the amplifier transistor 15, a variation of the ON characteristics of the reset transistor 16 which uses the electric charge accumulation region 14 as the active region—variations in a threshold voltage, a drain current, etc. which depend on a gate length—can be reduced, thereby stabilizing the electrical potential of the electric charge accumulation region 14. Thus, the leakage characteristics among the pixels are uniformed, thereby enabling a capture of a clear image. On the other hand, the gate of the amplifier transistor is short and mutual conductance gm increases inversely proportional to a $\sqrt{L}$ length, thereby increasing the driving capability and transmitting signals to the output signal line 18 at high speed.

Moreover, the amplifier transistor 15 and the selection transistor 17 are disposed in the same column. Maintaining ON/OFF characteristics of the selection transistor 17 provided by the gate voltage and shortening the gate length of the selection transistor 17 as well can lengthen the gate length of the amplifier transistor 15 and reduce the 1/f noise as calculated from Expression 1.

In this embodiment, when the cell size of the pixel 10 is 0.9 μm, the amplifier transistor 15 has a gate length ranging from approximately 0.2 μm to 0.3 μm, for example. The reset transistor 16 has a gate length ranging from approximately 0.2 μm to 0.5 μm, for example. The selection transistor 17 has a gate length ranging from approximately 0.1 μm to 0.5 μm, for example. Even when the cell size of the pixel is different, the gate length corresponding to the different cell size can be derived according to a proportion of change from the cell size of 0.9 μm.

Embodiment 2

Figure 4:
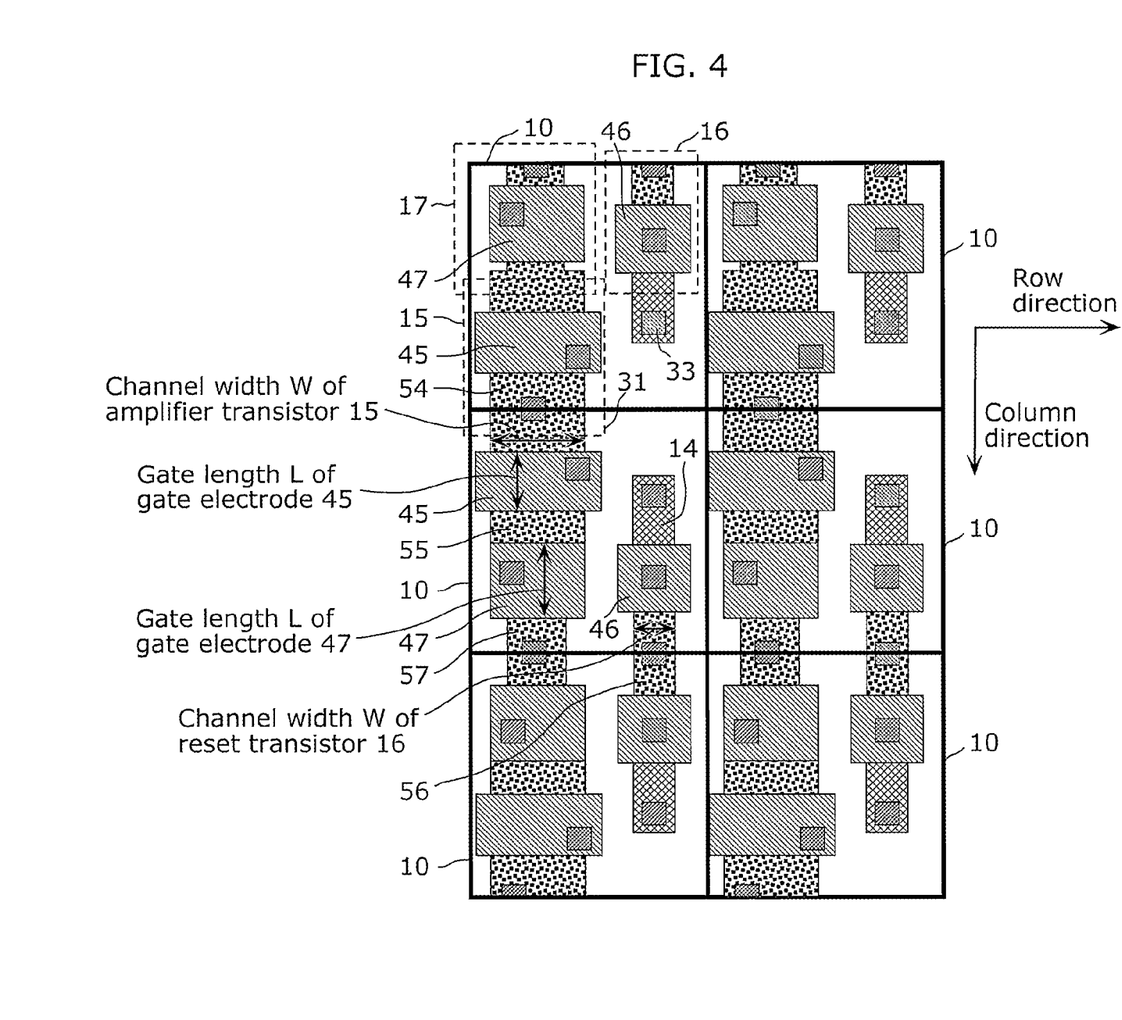
FIG. 4 is a plan view of a pixel in a solid-state imaging device according to Embodiment 2.

In this embodiment, a second plane structure of plural pixels 10 having a cross-sectional structure in FIG. 2A will be described.

FIG. 4 is a plan view of a pixel in the solid-state imaging device according to Embodiment 2. In the diagram, as in FIG. 3, the reset transistor 16 is isolated from the amplifier transistor 15 and the selection transistor 17 by the isolation region 31.

As illustrated in FIG. 4, the selection transistor 17 within the pixel shares a part of the active region 55 with the amplifier transistor 15 in the same pixel, and the active region 56 of the reset transistor 16 within the pixel is electrically isolated from the active region 55 of the amplifier transistor 15 in the same pixel. With this structure, the amplifier transistor 15 and the selection transistor 17, which require a high-speed driving capability, can have a large channel width. Moreover, the active region of the reset transistor 16 having a small surface area can allow the surface area of the pn junction between the surface doping region 32 and the electric charge accumulation region 14 to be small, thereby suppressing leakage in the pn junction.

Moreover, the reset transistor 16 is disposed between the selection transistor 17 in the same pixel and the selection transistor 17 in a horizontally adjacent pixel in the light receiving plane. Otherwise, the reset transistor 16 may be disposed between the amplifier transistor 15 in the same pixel and the amplifier transistor 15 in a horizontally adjacent pixel in the light receiving plane (not illustrated). With this structure, the reset transistor 16, which has a small channel width, and the amplifier transistor 15 and the selection transistor 17, which have a large channel width, can be disposed within a pixel with the channel directions being parallel to one another. As a result, the size of the pixels can be miniaturized easily while maintaining the noise characteristics.

Moreover, the amplifier transistor 15 has a channel width larger than the channel width of the reset transistor. From Expression 1, an increase in the channel width of the amplifier transistor 15 can reduce 1/f noise of the amplifier transistor 15. On the other hand, a decrease in the channel width of the reset transistor 16 can decrease the surface area of the pn junction in the electric charge accumulation region 14 which also serves as the active region of the reset transistor 16, and thus reduce the 1/f noise and a leakage current, thereby providing a high-sensitivity image having reduced noise components for a signal. Moreover, it is possible to increase a transistor channel width in order to provide a sufficient current for driving the amplifier transistor 15, which enables high-speed driving and reduces the 1/f noise which is one of noise components.

In this embodiment, when the cell size of the pixel is 0.9 µm, the amplifier transistor 15 has a channel width ranging from approximately 0.1 µm to 0.5 µm, for example. The reset transistor 16 has a channel width ranging from approximately 0.1 µm to 0.2 µm, for example. The selection transistor 17 has a channel width ranging from approximately 0.1 µm to 0.5 µm, for example. Even when the cell size of the pixel is different, the channel width corresponding to the different cell size can be derived according to a proportion of change from the cell size of 0.9 µm.

Moreover, the gate electrode 47 of the selection transistor 17 has a gate length shorter than the gate length of the gate electrode 45 of the amplifier transistor 15. With this, the amplifier transistor 15 can have a sufficient gate length, thereby reducing the 1/f noise which is one of the noise components.

With the above structure, it is possible to manufacture a solid-state imaging device having reduced leakage current and 1/f noise. Moreover, a pixel having a miniature size of approximately 1 µm can be implemented and an electric charge can be read out at high speed.

Although the solid-state imaging device according to the present disclosure has been described based on Embodiments 1 and 2, the present disclosure is not limited to Embodiments 1 and 2. Various modifications to Embodiment 1 and 2 that are conceived by the person skilled in the art and other configurations obtainable by combining the structural elements in the other embodiments without materially departing from the principles and spirit of the present disclosure are included within the scope of the present disclosure.

Moreover, the solid-state imaging device according to the above embodiments is typically achieved in the form of an integrated circuit or a large scale integrated (LSI) circuit. Each of their parts may be implemented as separate individual chips, or as a single chip to include a part or all thereof.

Moreover, the means for circuit integration is not limited to an LSI, but implementation with a dedicated circuit or a general-purpose processor is also available. It is also acceptable to use a field programmable gate array (FPGA) that is programmable after the LSI has been manufactured, and a reconfigurable processor in which connections and settings of circuit cells within the LSI are reconfigurable.

Moreover, in the above cross sectional view, etc., although corners and sides of the structural elements are illustrated linearly, products having rounded corners and sides for manufacturing reasons are also included in the present disclosure.

Moreover, all the above numerals are examples for specifically describing the present disclosure, and the present disclosure is not limited to the exemplified numerals. Moreover, the indication of n-type or p-type of impurity regions such as the surface doping region 32, the contact doping region 34, the active regions 54 to 57, and the like are examples for specifically describing the present disclosure, so the inversion of the n-type and p-type can provide the same results. Furthermore, all the above-described materials for the structural elements are examples for specifically describing the present disclosure, and the present disclosure is not limited to the exemplified materials. Furthermore, connections between the structural elements are examples for specifically describing the present disclosure, and connections for realizing the functions in the present disclosure is not limited to the exemplified connections.

Moreover, an example in which a MOS transistor is used has been described in the above description, but other transistors may be used.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device according to the present disclosure can be applicable to a solid-state imaging device having a stacked structure, low noise characteristics, and miniature-sized pixels.

The invention claimed is:
1. A solid-state imaging device comprising
pixels arranged two-dimensionally, each of the pixels including:
 a metal electrode;
 a photoelectric conversion layer that is on the metal electrode and converts light into an electrical signal;
 a transparent electrode on the photoelectric conversion layer; an electric charge accumulation region that is electrically connected to the metal electrode and accumulates electric charges from the photoelectric conversion layer;

an amplifier transistor that applies a signal voltage according to an amount of the electric charges in the electric charge accumulation region; and a reset transistor that resets electrical potential of the electric charge accumulation region, wherein the reset transistor includes a gate oxide film thicker than a gate oxide film of the amplifier transistor, and the reset transistor has a gate to which a voltage to turn off the reset transistor is applied, the voltage, when applied to the gate, collecting carriers, under the gate of the reset transistor, different from majority carriers of the electric charge accumulation region, the carriers to be collected being one of electrons and holes, the majority carriers being the other one of electrons and holes, and a power source circuit that applies a voltage to the transparent electrode, wherein the power source circuit includes a transistor including a gate oxide film thicker than the gate oxide film of the reset transistor.

2. The solid-state imaging device according to claim 1, wherein the amplifier transistor has a channel width larger than a channel width of the reset transistor.

3. The solid-state imaging device according to claim 1, wherein each of the pixels further includes a selection transistor that determines timing at which the amplifier transistor applies the signal voltage, the pixels include a first pixel, the selection transistor in the first pixel shares a part of an active region with the amplifier transistor in the first pixel, and the reset transistor in the first pixel has an active region electrically isolated from the active region of the amplifier transistor in the first pixel.

4. The solid-state imaging device according to claim 1, wherein each of the pixels further includes a selection transistor that determines timing at which the amplifier transistor applies the signal voltage, the pixels include a first pixel and a second pixel that is horizontally adjacent to the first pixel in a light receiving plane, and the reset transistor in the first pixel is disposed between the amplifier transistor in the first pixel and the amplifier transistor in the second pixel.

5. The solid-state imaging device according to claim 1, wherein the reset transistor has a gate length longer than a gate length of the amplifier transistor.

6. The solid-state imaging device according to claim 1, wherein the selection transistor has a gate length shorter than a gate length of the amplifier transistor.

7. The solid-state imaging device according to claim 1, wherein the pixels include a first pixel and a second pixel that is vertically adjacent to the first pixel in a light receiving plane, and the amplifier transistor in the first pixel and the amplifier transistor in the second pixel share an active region.

8. The solid-state imaging device according to claim 1, wherein each of the pixels further includes a selection transistor that determines timing at which the amplifier transistor applies the signal voltage, the pixels include a first pixel and a second pixel that is vertically adjacent to the first pixel in a light receiving plane, and the selection transistor in the first pixel and the selection transistor in the second pixel share an active region.

9. The solid-state imaging device according to claim 1, wherein the pixels include a first pixel and a second pixel that is vertically adjacent to the first pixel in a light receiving plane, and the reset transistor in the first pixel and the reset transistor in the second pixel share an active region.

10. The solid-state imaging device according to claim 1, wherein the reset transistor has a gate oxide film with a thickness ranging from 4 nm to 13 nm, and the amplifier transistor has a gate oxide film with a thickness ranging from 3 nm to 6 nm.

11. The solid-state imaging device according to claim 1, further comprising a surface doping region at a top of the electric charge accumulation region, wherein the electric charge accumulation region is of a first conductivity type and the surface doping region is of a second conductivity type different from the first conductivity type.

12. The solid-state imaging device according to claim 1, wherein each of the pixels further includes a selection transistor that determines timing at which the amplifier transistor applies the signal voltage, the pixels include a first pixel and a second pixel that is horizontally adjacent to the first pixel in a light receiving plane, and the reset transistor in the first pixel is disposed between the selection transistor in the first pixel and the selection transistor in the second pixel.

* * * * *